United States Patent
Li

(10) Patent No.: US 10,565,051 B2
(45) Date of Patent: Feb. 18, 2020

(54) ACCOMMODATING VARIABLE PAGE SIZES IN SOLID-STATE DRIVES USING CUSTOMIZED ERROR CORRECTION

(71) Applicant: Alibaba Group Holding Limited, Grand Cayman (KY)

(72) Inventor: Shu Li, Santa Clara, CA (US)

(73) Assignee: ALIBABA GROUP HOLDING LIMITED, Grand Cayman (KY)

( * ) Notice: Subject to any disclaimer, the term of this patent is extended or adjusted under 35 U.S.C. 154(b) by 82 days.

(21) Appl. No.: 15/889,645

(22) Filed: Feb. 6, 2018

(65) Prior Publication Data

US 2019/0243706 A1    Aug. 8, 2019

(51) Int. Cl.
| | | |
|---|---|---|
| G06F 11/10 | (2006.01) | |
| G06F 3/06 | (2006.01) | |
| H03M 13/11 | (2006.01) | |
| H03M 13/00 | (2006.01) | |
| G06F 12/02 | (2006.01) | |

(52) U.S. Cl.
CPC .......... *G06F 11/1068* (2013.01); *G06F 3/064* (2013.01); *G06F 3/0619* (2013.01); *G06F 3/0679* (2013.01); *G06F 12/0246* (2013.01); *H03M 13/1111* (2013.01); *H03M 13/6566* (2013.01); *G06F 2212/1032* (2013.01); *G06F 2212/2022* (2013.01)

(58) Field of Classification Search
CPC .................................................. G06F 11/1076
USPC ......................................................... 714/773
See application file for complete search history.

(56) References Cited

U.S. PATENT DOCUMENTS

| | | | |
|---|---|---|---|
| 5,220,568 A | * | 6/1993 | Howe ................... H03M 5/145 341/59 |
| 7,222,289 B2 | | 5/2007 | Hung |
| 7,246,259 B2 | | 7/2007 | Subbarao et al. |
| 7,383,485 B2 | | 6/2008 | Tran et al. |
| 7,447,948 B2 | | 11/2008 | Galbi et al. |
| 7,743,308 B2 | | 6/2010 | Subbarao |
| 7,996,746 B2 | | 8/2011 | Livshitz et al. |
| 8,694,715 B2 | * | 4/2014 | Weingarten ......... G11C 11/5628 365/185.03 |
| 8,880,976 B2 | | 11/2014 | Weathers |
| 9,184,767 B2 | | 11/2015 | Vernon |
| 9,229,813 B2 | | 1/2016 | Chatradhi et al. |
| 9,250,994 B1 | | 2/2016 | Vakilinia et al. |

(Continued)

*Primary Examiner* — Fritz Alphonse
(74) *Attorney, Agent, or Firm* — James J. DeCarlo; Greenberg Traurig, LLP

(57) ABSTRACT

Systems and methods for accommodating variable page sizes in solid-state drives using customized error correction are disclosed. In one embodiment, a system is disclosed comprising a NAND Flash storage device comprising a plurality of NAND Flash pages; a NAND FTL configured to convert a LBA of a NAND Flash page to a PBA; a syndrome calculator configured to calculate a syndrome using a LBA and an LBA parity matrix, the LBA associated with a read command issued by a host device; and an ECC decoder configured to: read a codeword located at a PBA associated with the LBA associated with the read command, the codeword including a plurality of user data bits and a plurality of parity bits, confirm that the codeword does not contain an error if the codeword converges with the syndrome, and transmit the user data bits to the host device as a response to the read command.

20 Claims, 7 Drawing Sheets

(56) References Cited

U.S. PATENT DOCUMENTS

| | | |
|---|---|---|
| 9,768,805 B2 | 9/2017 | Uliana et al. |
| 2008/0276156 A1 | 11/2008 | Gunnam et al. |
| 2008/0301521 A1 | 12/2008 | Gunnam et al. |
| 2009/0006924 A1 | 1/2009 | Ho |
| 2009/0122610 A1* | 5/2009 | Danon ................ G11C 11/5628 365/185.08 |
| 2010/0070825 A1 | 3/2010 | Efimov et al. |
| 2010/0131809 A1* | 5/2010 | Katz .................. G06F 12/0246 714/719 |
| 2011/0264987 A1 | 10/2011 | Li et al. |
| 2014/0164881 A1* | 6/2014 | Chen ...................... G11C 16/00 714/773 |
| 2016/0364292 A1 | 12/2016 | Yuan et al. |
| 2017/0085276 A1* | 3/2017 | Prabhakar .......... H03M 13/1111 |

* cited by examiner

ACCOMMODATING VARIABLE PAGE SIZES IN SOLID-STATE DRIVES USING CUSTOMIZED ERROR CORRECTION

COPYRIGHT NOTICE

This application includes material that may be subject to copyright protection. The copyright owner has no objection to the facsimile reproduction by anyone of the patent disclosure, as it appears in the Patent and Trademark Office files or records, but otherwise reserves all copyright rights whatsoever

BACKGROUND

Technical Field

This application relates to storage devices and, in particular, to systems, apparatuses, and methods for supporting variable sector sizes in solid state devices.

Description of the Related Art

A fundamental and readable unit of NAND Flash solid-state drive (SSD) devices is the "sector" or "page." SSDs store all data on a number of pages arranged within multiple logical layers of the SSD. Early, and current, traditional solid-state drive (SSD) devices utilized fixed sector sizes of 512 bytes or 4096 bytes (4 KB). More recently, SSDs have supported "variable sector sizes." A variable sector size refers to supporting sector sizes beyond standard 512 B and 4 KB sector sizes including random sector sizes. Advances in computer architecture, such as the proliferation of NVM Express (NVMe) devices, have resulted in many options of sector sizes including 520, 528, 4104, 4160, and 4224-byte page sizes. Variable sector sizes are designed to allow users and applications to insert additional management information together with actual data stored on SSDs in each sector.

The need to store additional data in sectors arises due to the fundamental characteristics of NAND Flash memory. Specifically, management data for a given page is ideally stored in a region of the page so that the management data can be read along with the page, eliminating multiple reads. Additionally, the logical block address (LBA) of each sector is stored as management data in the sector, usually in an out-of-band (OOB) region of the sector. LBA data is stored within a sector so that the LBA to physical block address (PBA) mapping can be re-built by reading content of individual sectors.

The preceding use of management data suffers from multiple deficiencies. First, storing the LBA in the OOB region of a sector result in unnecessary reads. Since NAND Flash memory degrades with accesses, NAND Flash memory storing the LBA in the OOB region hastens the failure of the underlying memory device. Second, due to the presence of errors in reading and writing to NAND Flash memory, copies of the LBA-to-PBA mapping must be replicated in one or more locations of NAND Flash memory, thus limiting the usable storage size of the memory.

BRIEF SUMMARY

The disclosed embodiments remedy these deficiencies by providing systems, devices, and methods for removing the LBA from storage on the NAND Flash device. In contrast to current systems that occupy NAND Flash storage space with the LBA of each page, the disclosed embodiments remove this limitation and thus increase the total useable space of the NAND Flash device. Thus, for NAND Flash devices having variable sector sizes, the method enables an increased amount of storage while minimizing the number of parity bits needed to correct errors in individual NAND Flash pages.

In order to implement the above solution, the disclosed embodiments provide an improved NAND Flash device that includes a syndrome calculator and an improved error-correcting code (ECC) encoder/decoder. Specifically, the syndrome calculator calculates a syndrome based on an LBA for a given page. This syndrome is used to encode and decode NAND Flash pages during write and read operations, respectively. The result is that a given codeword is strongly correlated with the LBA due to the use of the LBA-based syndrome and storage of the LBA in the NAND Flash page is unnecessary. The disclosed embodiments additionally describe a method for rebuilding an LBA-to-PBA mapping of a NAND Flash device without requiring storage of the LBAs in individual NAND Flash pages.

In one embodiment, a system is disclosed comprising a NAND Flash storage device comprising a plurality of NAND Flash pages; a NAND Flash translation layer (FTL) configured to convert a logical block address (LBA) of a NAND Flash page to a physical block address (PBA); a syndrome calculator configured to calculate a syndrome using a logical block address (LBA) and an LBA parity matrix, the LBA associated with a read command issued by a host device; and an error-correcting code (ECC) decoder configured to: read a codeword located at a PBA associated with the LBA associated with the read command, the codeword including a plurality of user data bits and a plurality of parity bits, confirm that the codeword does not contain an error if the codeword converges with the syndrome, and transmit the user data bits to the host device as a response to the read command.

In another embodiment, a method is disclosed comprising receiving a read command from a host device, the read command including a logical block address (LBA) of a NAND Flash page; reading a codeword located at a physical block address (PBA) associated with the LBA, the codeword including a plurality of user data bits and a plurality of parity bits; calculating a syndrome using the LBA and an LBA parity matrix; confirming that the codeword does not contain an error if the codeword converges with the syndrome; and transmitting the user data bits to the host device as a response to the read command.

In another embodiment, a method is disclosed comprising selecting a NAND Flash page; reading user data and parity bits stored in the NAND Flash page; appending a logical block address (LBA) portion to the user data and parity bits to form a codeword, the LBA portion comprising all zeros; assigning a likelihood to each bit in the LBA portion; decoding the codeword with a soft-decision decoder, the soft decision decoder using a message-passing algorithm; and confirming an LBA of the NAND Flash page after at least one iteration of the message-passing algorithm.

BRIEF DESCRIPTION OF THE FIGURES

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

Figure 1:
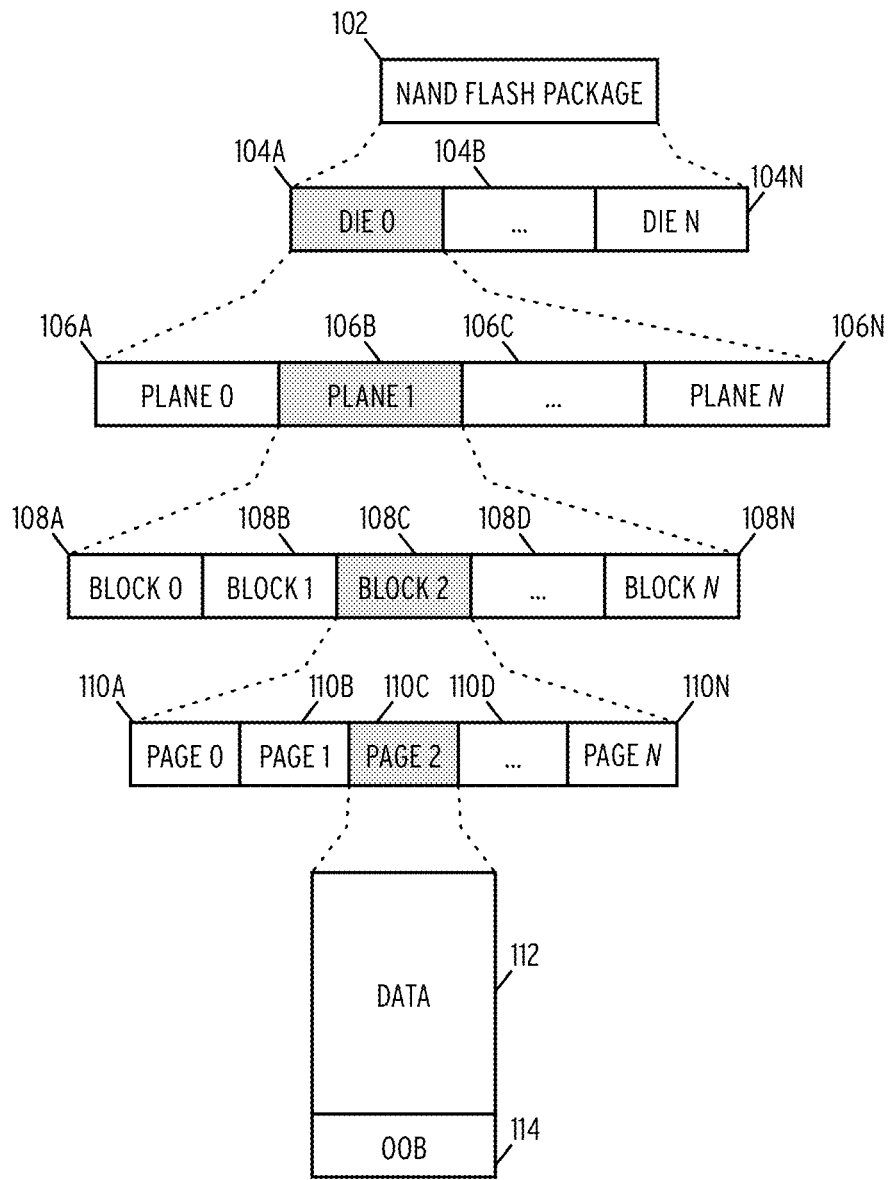
FIG. 1 is a logical diagram illustrating the layout of a NAND Flash package according to some embodiments of the disclosure.

The present disclosure will now be described more fully hereinafter with reference to the accompanying drawings, which form a part hereof, and which show, by way of illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general-purpose computer to alter its function as detailed herein, a special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

These computer program instructions can be provided to a processor of: a general purpose computer to alter its function to a special purpose; a special purpose computer; ASIC; or other programmable digital data processing apparatus, such that the instructions, which execute via the processor of the computer or other programmable data processing apparatus, implement the functions/acts specified in the block diagrams or operational block or blocks, thereby transforming their functionality in accordance with embodiments herein.

For the purposes of this disclosure a computer readable medium (or computer-readable storage medium/media) stores computer data, which data can include computer program code (or computer-executable instructions) that is executable by a computer, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

FIG. 1 is a logical diagram illustrating the layout of a NAND Flash package according to some embodiments of the disclosure.

NAND Flash package (102) comprises a memory device. In some embodiments, NAND Flash package (102) comprises a memory chip used, for example, in a solid-state storage device (SSD). SSD devices comprise devices used as hard disks, portable storage drives, and other uses. NAND Flash package (102) represents the highest level of organization of a Flash storage device. In some embodiments, SSDs include multiple NAND Flash packages configured on a single circuit board, substrate, or other connective device.

The highest level of organization NAND Flash package (102) is a die, as illustrated in FIG. 1 as dies (104A, 104B, 104N). The number of dies in a NAND Flash package (102) may be any number suitable for the operation of NAND Flash package (102). In common scenarios, a NAND Flash package will include one, two, or four dies. While any number of dies may be used, the number of dies is generally a power of two. A given die (104A) is the smallest unit that may execute commands independently.

A given die (104A) includes one or more planes (106A, 106B, 106C, and 106N). In practice, a die includes one or two planes, however the number of planes is not explicitly limited to one or two planes. In general, concurrent operations may be executed at the plane-level.

Each plane (106A, 106B, 106C, and 106N) includes one or more blocks. For example, as illustrated, plane (106B) includes blocks (108A, 108B, 108C, 108D, and 108N). In general, the number of blocks is limited by the plane size as well as a defined block size (e.g., 4 MB or 8 MB). A block (e.g., 108A) is the smallest unit of data that may be erased.

Each block includes a number of pages. For example, as illustrated, block 108C includes pages (110A, 110B, 110C, 110D, 110N). As with blocks, the number of pages is limited by the plane size as well as a defined page size (e.g., 8 KB or 16 KB). A page is the smallest unit that may be written to. Combined with the block-level erasure constraint, in order to "erase" a page, the entire underlying block must be erased, thus requiring that other valid pages in the block be "saved" before erasing the block, and thus the other pages included in the block.

A given page (e.g., page 110C), includes a data portion (112) and an out-of-band region (114). The data portion (112) includes the user data stored by the NAND Flash package (102) in the respective page. The OOB portion (114) stores various metadata properties of the page, as discussed herein. The OOB portion (114) includes parity bits generated during write operations and used during read operations to detect errors in the user data. In general, the NAND Flash package (102) may utilize various types of linear block encoding schemes to generate the parity bits such as Hamming Codes, Bose, Chaudhuri, and Hocquenghem (BCH) codes, Reed-Solomon codes, turbocodes, or Low Density Parity Codes (LDPC). The OOB portion (114) additionally stores a logical block address (LBA) that identifies the logical location of the page (e.g., 110C) within the package. Storing the LBA in OOB portion (114) allows for an LBA to physical block address (PBA) remapping in the event that an LBA-to-PBA mapping is corrupted or otherwise lost. In general, the LBA-to-PBA mapping is stored separately from the pages themselves and is utilized by a Flash translation layer (FTL) to convert LBAs in, for example, read/write commands to a PBA utilized to extract individual pages. In certain pages (e.g., the first and last pages of a block), the OOB region (114) may additionally include an erase count, erase seal flag, sequence number, and a bad block indicator.

Figure 2:
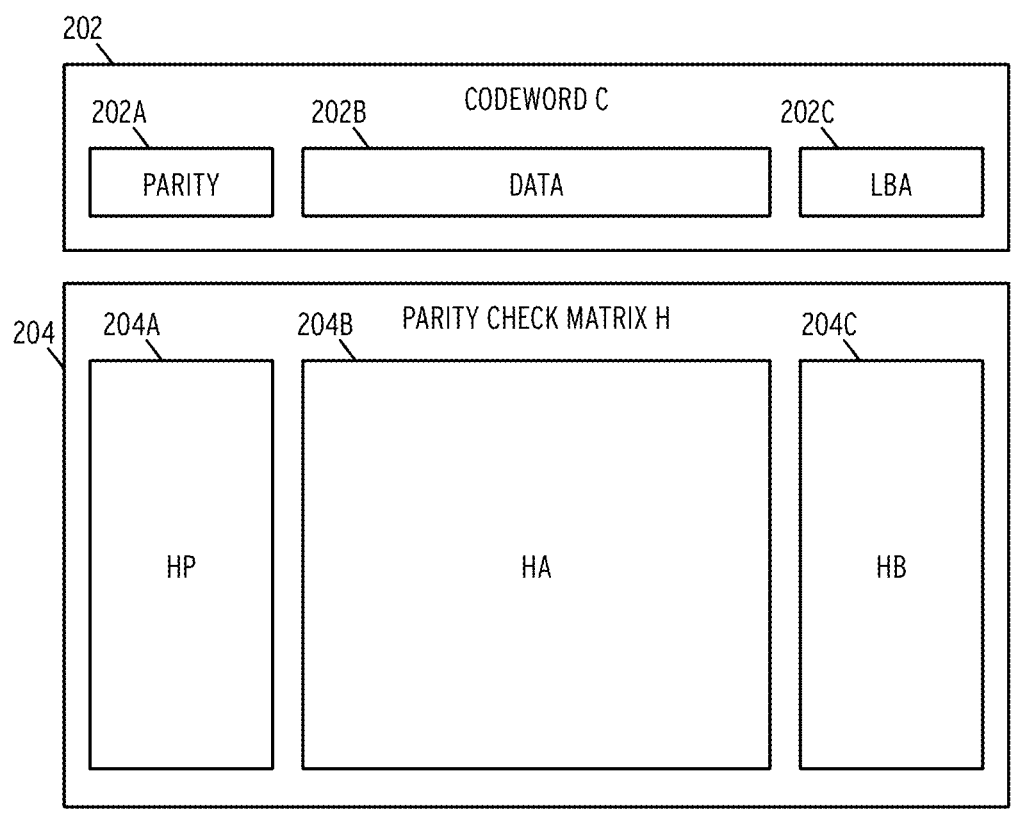
FIG. 2 is a diagram of a codeword and parity check matrix used to decode and encode NAND Flash pages according to some embodiments of the disclosure.

FIG. 2 is a diagram of a codeword and parity check matrix used to decode and encode NAND Flash pages according to some embodiments of the disclosure.

FIG. 2 specifically illustrates a conventional technique for performing error code correction (ECC) on NAND Flash data. In general, during decoding, a codeword C (202) is retrieved from the NAND Flash package that includes a parity bit portion (202A), a user data portion (202B), and an LBA portion (202C). As discussed above, user data portion (202B) and LBA portion (202C) are stored within the Flash page in the user data segment and OOB region, respectively.

The parity portion (202A) likewise is stored in the OOB region. During a read, the codeword C (202) is read from the package.

In order to decode the codeword and identify the presence of errors, a parity check matrix H (204) is used. The parity check matrix H includes three submatrices: a parity matrix HP (204A), a data matrix HA (204B), and an LBA matrix HB (204C). In decoding, current systems compute $H \cdot C^T$ to identify whether any errors exist in codeword C (202). Specifically, an error-free codeword results in $H \cdot C^T = 0$ (or, equally $C \cdot H^T = 0$).

As can be seen in FIG. 2, C=[Parity|Data|LBA] and H=[HP|HA|HB]. From this, it can be derived that [Parity|Data]·[HP|HA]=[LBA|HB]. In other word, the product [LBA|HB] is equal to the syndrome S. Since the submatrices HP, HA, and HB are known by the NAND Flash package, and the LBA is provided during all operations affecting an address of a page of a NAND Flash package, the syndrome S may be calculated in real-time from the dot product of LBA and HB during the operations themselves. In this manner, the LBA is not required to be written to NAND Flash memory and thus, the amount of data stored in the NAND Flash memory may be reduced. The disclosed embodiments discuss various systems, devices, and methods for implementing the above LBA extraction by modifying, for example, the read and write operations performed by a NAND Flash device.

Figure 3:
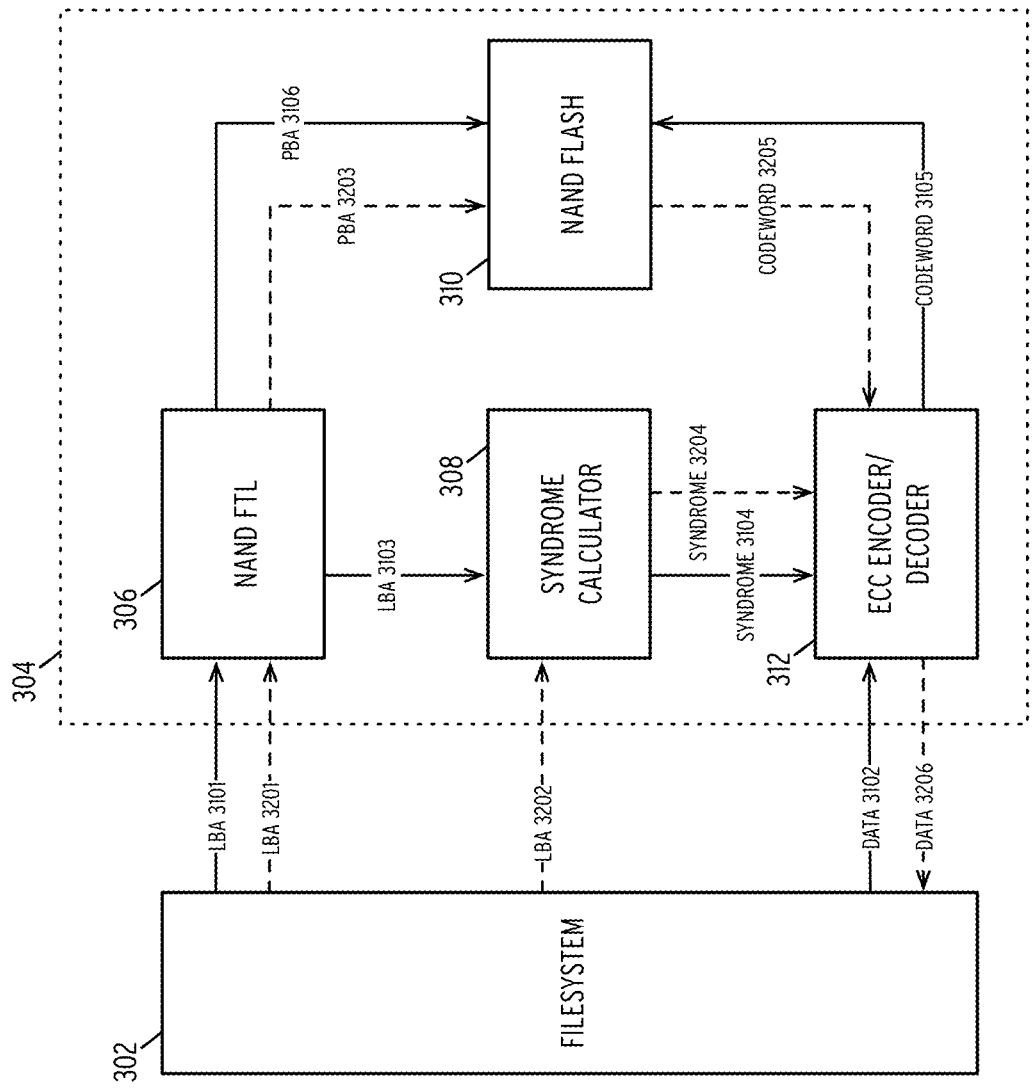
FIG. 3 is a block diagram illustrating a system for accessing a NAND Flash package according to some embodiments of the disclosure.

FIG. 3 is a block diagram illustrating a system for accessing a NAND Flash package according to some embodiments of the disclosure.

In the illustrated embodiment, the system includes a filesystem (302). In one embodiment, the filesystem (302) may comprise any type of filesystem providing access to NAND Flash (310). For example, filesystem (302) may comprise an ext2 filesystem implemented by a client device such as that illustrated in FIG. 7. The filesystem (302) issues, for example, read and write commands for retrieving data from and storing data to, respectively, NAND Flash (310). The flow of information for write commands is illustrated by solid lines (3101-3106). The flow of information for read commands is illustrated by dotted lines (3201-3206).

In addition to the filesystem (302), the system includes a Flash chip (304). The Flash chip (304) includes a NAND Flash translation layer (FTL) (306). FTL (306) comprises a translation layer for mapping LBAs to PBAs. In some embodiments, FTL (306) is located on the Flash chip (304) itself (e.g., in firmware). In other embodiments, FTL (306) may reside on a host device (e.g., the device operating the filesystem (302)). Flash chip (304) additionally includes NAND Flash storage (310) which may comprise a storage medium such as that illustrated in FIG. 1 (e.g., the dies, planes, blocks, and pages storing data).

Flash chip (304) additionally includes a syndrome calculator (308). In one embodiment, the syndrome calculator (308) may comprise a dedicated microprocessor embedded on the Flash chip (304). For example, syndrome calculator (308) may comprise a dedicated microcontroller, a field-programmable gate array (FPGA), or dedicated ASIC for performing syndrome calculations. In one embodiment, syndrome calculator (308) stores the LBA parity matrix while in other embodiments the syndrome calculator (308) may access the LBA parity matrix from memory (not illustrated) onboard the Flash chip (304). In one embodiment, the submatrices used by syndrome calculator (308) comprise the HB matrix discussed in the description of FIG. 2.

Similar to syndrome calculator (308), the ECC encoder/decoder (312) may comprise a dedicated microprocessor embedded on the Flash chip (304). In some embodiments, the ECC encoder/decoder (312) may comprise a separate ECC encoder and a separate ECC decoder. For example, ECC encoder/decoder (312) may comprise a dedicated microcontroller, a field-programmable gate array (FPGA), or dedicated ASIC for performing syndrome calculations. As with syndrome calculator (308), the ECC encoder/decoder (312) may store a parity check matrix locally or access the parity check matrix from an external memory. In one embodiment, the submatrices used by ECC encoder/decoder (312) comprise submatrices HP and HA discussed in the description of FIG. 2. In one embodiment, the ECC encoder/decoder (312) may comprise a soft-decision decoder.

During a write operation, the filesystem (302) transmits an LBA to the NAND FTL (306) (line 3101). The NAND FTL (306) generates a PBA for accessing NAND Flash (310) (line 3106). Simultaneously, the NAND FTL (306) transmits the LBA to the syndrome calculator (308) (line 3103) which computes the syndrome for the LBA and transmits the syndrome to ECC encoder/decoder (312) (line 3104). The ECC encoder/decoder (312) encodes the data received from the filesystem (line 3102) using the syndrome and writes the codeword to NAND Flash (310) (line 3105).

During a read operation, the filesystem (302) transmits an LBA to the NAND FTL (306) and syndrome calculator (308) (lines 3201, 3202). As in a write operation, the NAND FTL (306) generates a PBA for accessing NAND Flash (310) (line 3203) and the syndrome calculator (308) computes the syndrome for the LBA and transmits the syndrome to ECC encoder/decoder (312) (line 3204). The ECC encoder/decoder (312) access the codeword from NAND Flash (310) using the PBA (line 3205). The ECC encoder/decoder (312) then checks the codeword for errors using the syndrome and parity check matrices (HP and HA). The ECC encoder/decoder (312) transmits the error-checked codeword back to the filesystem (302) (line 3206).

Figure 4:
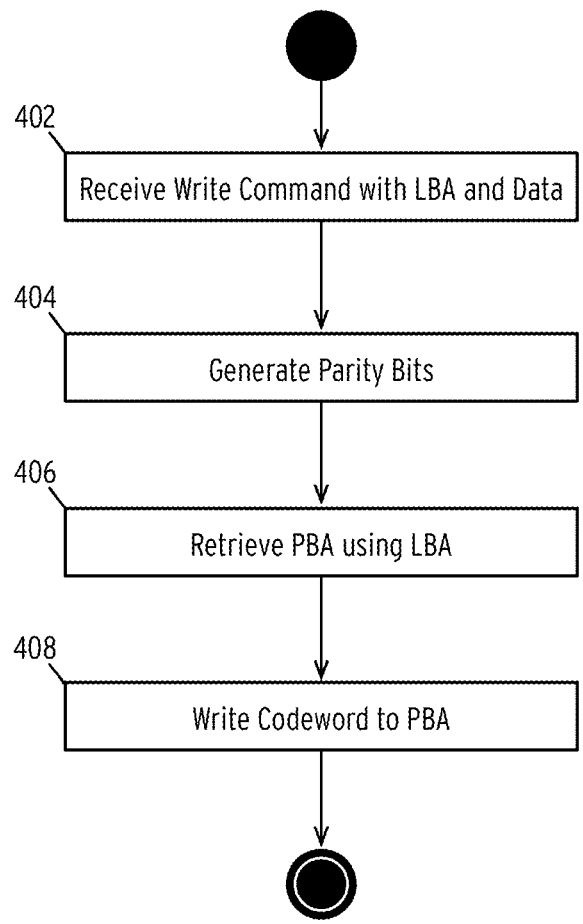
FIG. 4 is a flow diagram illustrating a method for writing data to a NAND Flash page according to some embodiments of the disclosure.
Figure 5:
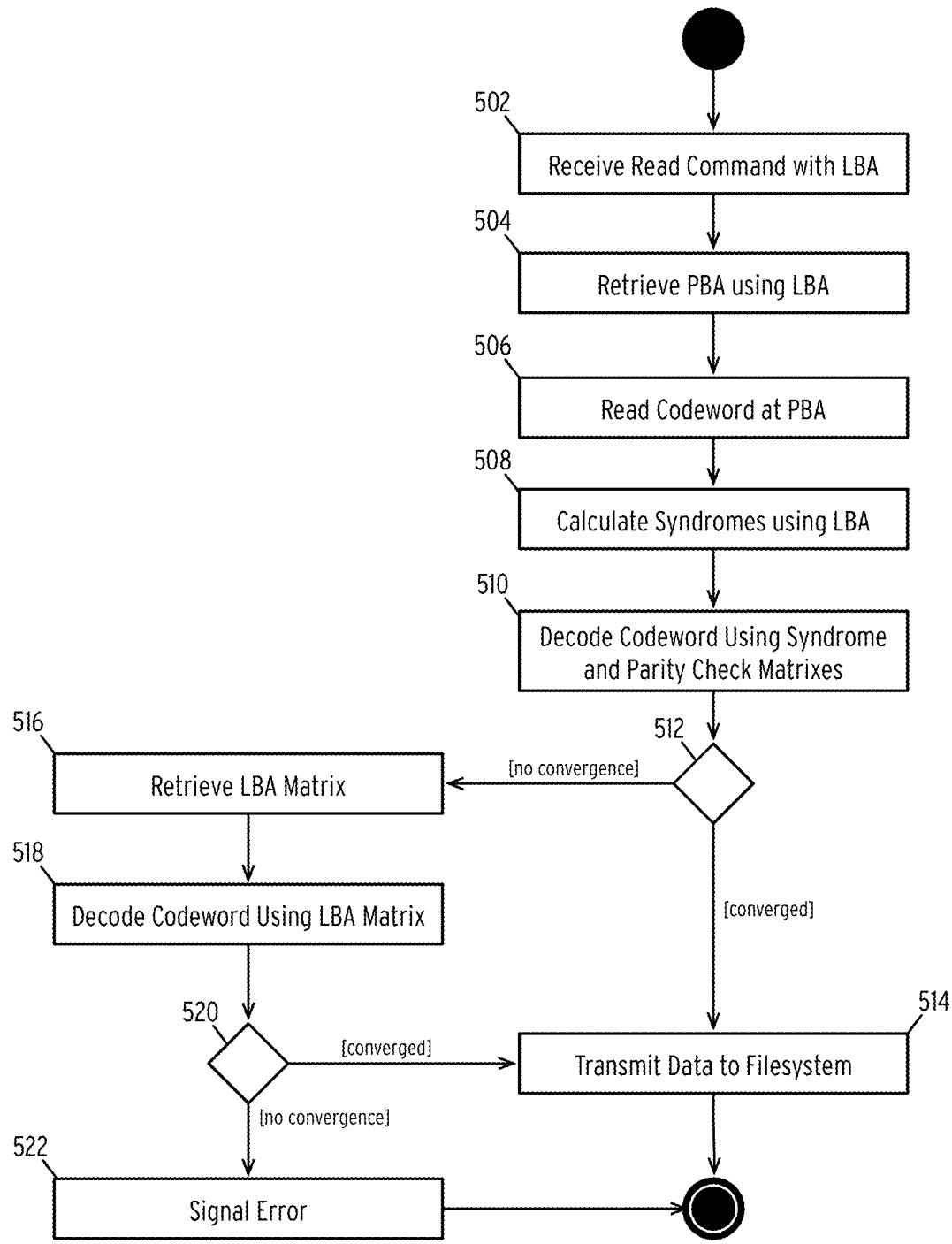
FIG. 5 is a flow diagram illustrating a method for reading data to a NAND Flash page according to some embodiments of the disclosure.

The specific details of these write and read operations are discussed more fully in connection with FIGS. 4 and 5, respectively.

FIG. 4 is a flow diagram illustrating a method for writing data to a NAND Flash page according to some embodiments of the disclosure.

In step 402, the method receives a write command, the write request including an LBA and user data.

In the illustrated embodiment, the write command is issued by a filesystem of a client device as discuss in the description of FIG. 3. In one embodiment, the write command includes an LBA identifying the logical location on the NAND Flash package where data should be written. The write command additionally includes a plurality of bytes representing the user data to write to the NAND Flash package.

In step 404, the method generates a plurality of parity bits to form a codeword using the data included within the write command.

In one embodiment, the method generates the plurality of parity bits by computing the dot product of the data included within the write command and a generator matrix G. As known in the art, the generator matrix G may be generated based on transposing the user data matrix HA and the parity matrix HP. When computing the codeword, the computing causes the codeword to converge onto a pre-computed syndrome S (discussed in more detail in the description of FIG. 5).

In step 406, the method retrieves a PBA based on the LBA associated with the write command.

Although illustrated as occurring after step 404, the method may compute the PBA in step 406 at any time prior to step 408 and the computation of the PBA may be performed in parallel with step 404. In one embodiment, the PBA is calculated using a FTL (as described previously). The PBA represents the physical address of the page identified by the LBA.

In step 408, the method uses the PBA to write the codeword to the NAND Flash memory.

As discussed in the description of step 406, the codeword comprises a user data portion and a parity bit portion. Thus, in contrast to existing NAND Flash memories, the LBA is not included within the codeword. Thus, in step 408, the method writes the user data and parity bits to the physical page identified by the PBA.

While the LBA is not written to the page identified by the PBA, the use of the LBA to generate the syndrome used in encoding results in a strong correlation between the LBA with the user bits. Specifically, because the LBA-based syndrome is used to converge the parity bits in the codeword, the resulting codeword is strongly correlated with the LBA used to generate the syndrome.

FIG. 5 is a flow diagram illustrating a method for reading data to a NAND Flash page according to some embodiments of the disclosure.

In step 502, the method receives a read command from the filesystem.

In the illustrated embodiment, the read command is issued by a filesystem of a client device as discuss in the description of FIG. 3. In one embodiment, the read command includes an LBA identifying the logical location on the NAND Flash package where data should be read from.

In step 504, the method calculates a PBA using the LBA associated with the read command. In one embodiment, the PBA is calculated using a FTL (as described previously). The PBA represents the physical address of the page identified by the LBA.

In step 506, the method reads a codeword located at the PBA calculated in step 504. In one embodiment, reading the codeword comprises issuing a read command to the underlying NAND Flash memory to retrieve a codeword at the PBA.

In one embodiment, the returned codeword may be represented as R where R is of length n, where n is equal to the length of the user data k plus a set of parity bits n-k. In order to correct for errors, R may be considered as R=c+e, where c represents a valid codeword and e represents an error vector.

In step 508, the method calculates syndromes using the LBA, similar to the calculations performed in step 404, the disclosure of which is incorporated herein by reference in its entirety.

In step 510, the method attempts to decode the codeword R using the syndrome.

In one embodiment, in step 510, the method computes the dot product of the received codeword R with a parity matrix $H_{small}$. In one embodiment, $H_{small}$ comprises the matrix HP and HA (i.e., [HP|HA]) discussed previously. In contrast to existing NAND Flash systems, the use of $H_{small}$ results in a shorter latency in finishing local iterations of the ECC decoding routing given that $H_{small}$<[HP|HA|HB].

As indicated above, in step 510, the method may compute $R \cdot H_{small}^T$ to obtain an identification of a coset leader or leaders for the received codeword.

In step 512, the method determines whether the decoding converges on the syndrome S. In one embodiment, the method determines that the decoding converges on the syndrome S if $R \cdot H_{small}^T=0$. In this scenario, the decoding succeeds without identifying any errors in the received codeword R.

In one embodiment, as part of step 512, the method may correct any correctable errors identified in step 510. That is, the method may correct any errors corresponding to correctable coset leaders of the syndrome S.

In step 514, the method transmits the codeword R to the filesystem upon determining that $R \cdot H_{small}^T=0$. That is, the method returns the codeword to the filesystem as a response to the read command upon determining that the codeword does not include any errors.

As illustrated above, the use of $H_{small}$ enables quicker decoding of read codewords from the NAND Flash memory due to the smaller size of the parity matrices. However, since the parity matrices do not include the LBA parity matrix and since the codeword does not include the LBA, the correlation and assistance from the larger HB matrix is lost. Thus, the possibilities for errors that cannot be correct exist due to the smaller parity check matrices. To compensate for this, the method further includes a subroutine for utilizing the full HB matrix in decoding.

In step 516, the method retrieves the LBA matrix HB upon the method determining that the decoding did not converge upon the syndrome S (i.e., a correctable coset leader). A given codeword may not converge upon a syndrome S in the scenario where the raw bit error rate is higher than a correctable error rate supported by $H_{small}$.

In step 518, the method decodes the codeword using the LBA matrix.

In one embodiment, in step 518, the method adds the LBA to the codeword to generate a codeword including the user data, parity bits, and LBA. Further, the method adds the LBA matrix (HB) to the parity check matrix [HP|HA]. Thus, the codeword and parity check matrix is identical to that illustrated in FIG. 2. However, in contrast to current systems that utilize the parity check matrix and codeword in FIG. 2, the LBA in step 518 is guaranteed to be correct since the LBA is received from the filesystem. That is, the soft information LBA is guaranteed to not include any error bits and thus may be assigned a maximum confidence level for co-decoding.

During the decoding processing step 518, the maximum confidence in the LBA portion of the codeword assists a soft-decision decoder in correcting errors by evolving the soft information on other variable nodes and check nodes. Thus, by using the known LBA, the method can converge the codeword upon the syndrome S even when a high raw bit error rate is present.

In step 520, the method determines whether the soft-decoding converges on the syndrome S, similar to the process described in step 512. In one embodiment, the method again determines that the decoding converges on the syndrome S if $R \cdot H^T=0$, where H represents the full parity check matrix. In this scenario, the decoding succeeds without identifying any errors in the received codeword R. In one embodiment, as part of step 520, the method may correct any correctable errors identified in step 518. That is, the method may correct any errors corresponding to correctable coset leaders of the syndrome S.

If the codeword can be decoded and any errors corrected using the full parity check matrix, the method transmits the codeword R to the filesystem. That is, the method returns the codeword to the filesystem as a response to the read command upon determining that the codeword does not include any errors.

Alternatively, in the scenario where the codeword still fails to converge upon the syndrome S, the method may signal an error in the decoding processing in step 522. In one embodiment, the method may further identify the bits that contain an uncorrectable error.

Figure 6:
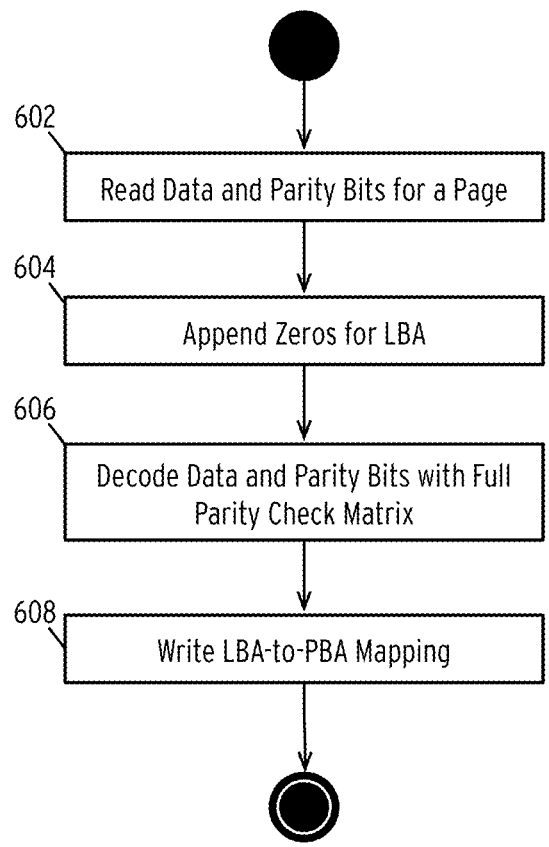
FIG. 6 is a flow diagram illustrating a method for rebuilding an LBA-to-PBA mapping according to some embodiments of the disclosure.

FIG. 6 is a flow diagram illustrating a method for rebuilding an LBA-to-PBA mapping according to some embodiments of the disclosure.

As illustrated above, the disclosed embodiments avoid the storage of the LBA of a given NAND Flash page in the OOB region of the respective page. Generally, NAND Flash devices store multiple copies of the LBA-to-PBA mapping table used by the NAND FTL to compensate for the potential loss of one or more copies of the LBA-to-PBA mapping tables. Specifically, these tables are stored at multiple, different locations on a given NAND Flash device in order to avoid loss of data. While remote, the possibility of losing all copies of the LBA-to-PBA mapping table exists. The method disclosed in FIG. 6 illustrates method for restoring a totally lost LBA-to-PBA mapping using the matrices discussed above. In the illustrated embodiment, the method may be performed for each page in a NAND Flash memory in order to recover an LBA associated with the page.

In step 602, the method reads a codeword comprising data and parity bits for a given NAND Flash page.

As discussed above, the NAND Flash only stores the user data and parity bits generated during the write process discussed in FIG. 3. In this embodiment, the method does not utilize an LBA to access the given page. In contrast, the pages may be selected sequentially.

In step 604, the method appends zeros for the LBA portion of the codeword.

As discussed above, a codeword may comprise parity bits, a user data portion, and an LBA portion. In step 604, the method uses a one-dimensional zero matrix as the LBA portion of the codeword. Thus, the codeword may comprise C=[Parity|Data|0].

The method illustrated in FIG. 6 may utilize a soft-decision decoder as part of the recovery process (as described above). Thus, each bit of the codeword C may be assigned "soft information" indicating the likelihood of possible values. In one embodiment, the soft information for each bit in the LBA portion of the codeword is set to a 50% change of either 1 or 0.

In step 606, the method decodes the zero-appended codeword using the full parity check matrix.

In one embodiment, the method may utilize a method-passing decoding algorithm using the zero-appended codeword, the full parity check matrix, and the soft information of the zeroed LBA portion of the codeword. Using LDPC as an example, the method may construed a graph (e.g., a Tanner graph) corresponding to the full parity check matrix, the graph comprising a set of check nodes corresponding to the rows of the full parity check matrix and a set of bit nodes corresponding to the columns of the full parity check matrix.

Using this graph, the method passes each codeword received along the edges of the graph corresponding to the full parity check matrix. First, the codeword is passed from bit nodes to check nodes and then from check nodes back to bit nodes. These two passes form a single iteration through the graph. At the end of an iteration, the bit nodes compute the reliability of the messages by summing the incoming messages. The method continues to pass messages in this fashion until a maximum number of iterations have been processed or all of the parity check equations for a given codeword have been satisfied.

In step 608, the method writes the recovered LBA-to-PBA mapping. In one embodiment, the method may store the LBA-to-PBA mapping in a designated location on the NAND Flash device.

Figure 7:
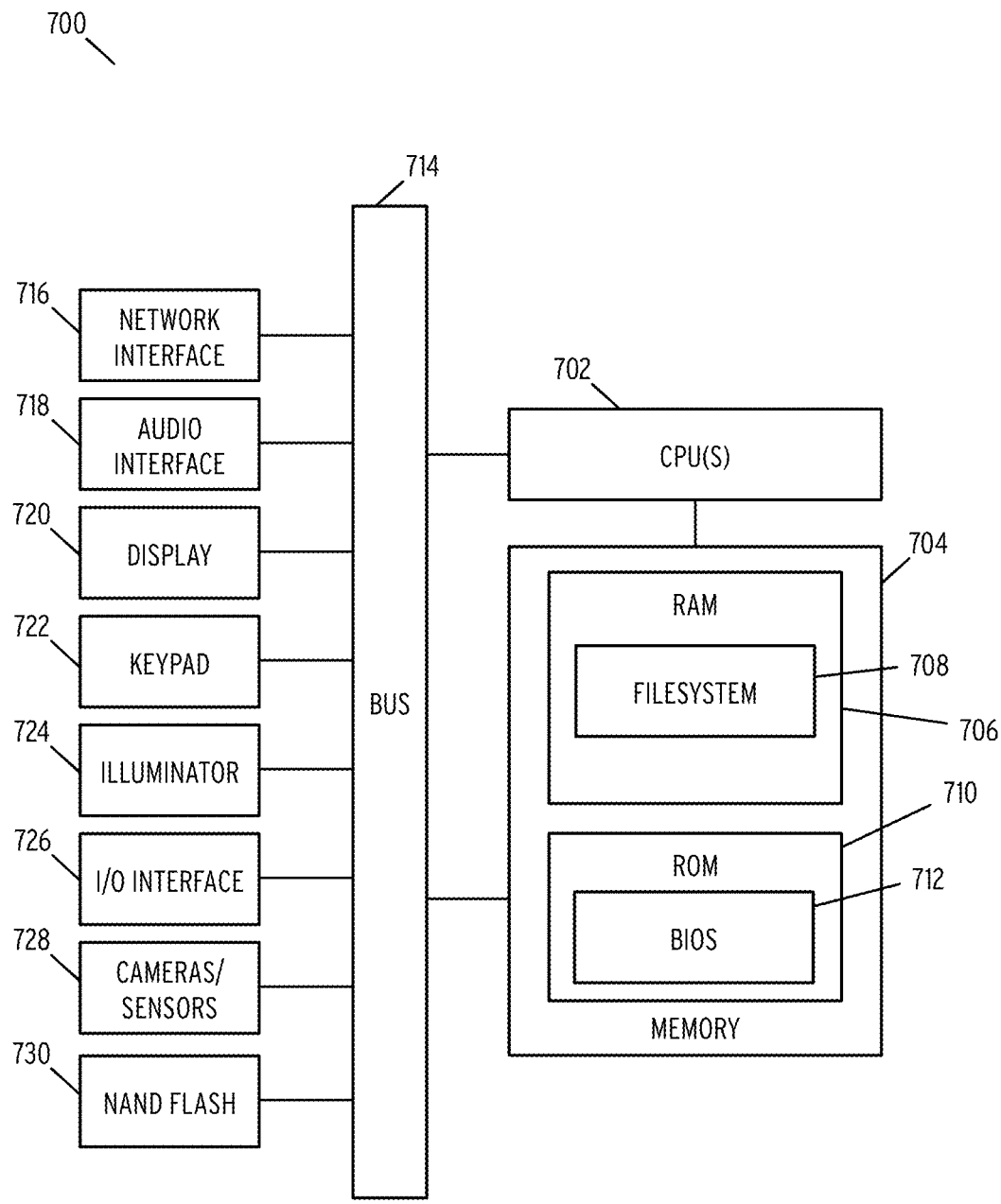
FIG. 7 is a hardware diagram illustrating a device for accessing a NAND Flash device according to some embodiments of the disclosure.

FIG. 7 is a hardware diagram illustrating a device for accessing a NAND Flash device according to some embodiments of the disclosure.

Client device (700) may include many more or fewer components than those shown in FIG. 7. However, the components shown are sufficient to disclose an illustrative embodiment for implementing the present disclosure.

As shown in FIG. 7, client device (700) includes processing units (CPUs) (702) in communication with a mass memory (704) via a bus (714). Client device (700) also includes one or more network interfaces (716), an audio interface (718), a display (720), a keypad (722), an illuminator (724), an input/output interface (726), and a camera(s) or other optical, thermal or electromagnetic sensors (728). Client device (700) can include one camera/sensor (728), or a plurality of cameras/sensors (728), as understood by those of skill in the art.

Client device (700) may optionally communicate with a base station (not shown), or directly with another computing device. Network interface (716) includes circuitry for coupling client device (700) to one or more networks and is constructed for use with one or more communication protocols and technologies. Network interface (716) is sometimes known as a transceiver, transceiving device, or network interface card (NIC).

Audio interface (718) is arranged to produce and receive audio signals such as the sound of a human voice. For example, audio interface (718) may be coupled to a speaker and microphone (not shown) to enable telecommunication with others and generate an audio acknowledgement for some action. Display (720) may be a liquid crystal display (LCD), gas plasma, light emitting diode (LED), or any other type of display used with a computing device. Display (720) may also include a touch sensitive screen arranged to receive input from an object such as a stylus or a digit from a human hand.

Keypad (722) may comprise any input device arranged to receive input from a user. For example, keypad (722) may include a push button numeric dial, or a keyboard. Keypad (722) may also include command buttons that are associated with selecting and sending images. Illuminator (724) may provide a status indication and provide light. Illuminator (724) may remain active for specific periods of time or in response to events. For example, when illuminator (724) is active, it may backlight the buttons on keypad (722) and stay on while the client device is powered. Also, illuminator (724) may backlight these buttons in various patterns when particular actions are performed, such as dialing another client device. Illuminator (724) may also cause light sources positioned within a transparent or translucent case of the client device to illuminate in response to actions.

Client device (700) also comprises input/output interface (726) for communicating with external devices, such as UPS or switchboard devices, or other input or devices not shown in FIG. 7. Input/output interface (726) can utilize one or more communication technologies, such as USB, infrared, Bluetooth™, or the like.

Mass memory (704) includes a RAM (706), a ROM (710), and other storage means. Mass memory (704) illustrates another example of computer storage media for storage of information such as computer-readable instructions, data structures, program modules or other data. Mass memory (704) stores a basic input/output system ("BIOS") (712) for controlling low-level operation of client device (700). The mass memory may also stores an operating system for controlling the operation of client device (700). It will be appreciated that this component may include a general purpose operating system such as a version of UNIX, or LINUX™, or a specialized client communication operating system such as Windows Client™, or the Symbian® operating system. The operating system may include, or interface with a Java virtual machine module that enables control of hardware components and operating system operations via Java application programs.

Memory (704) further includes a filesystem (708). In one embodiment, filesystem (708) may comprise a standard filesystem such as ext3 or any suitable filesystem. As discussed above, filesystem (708) issues read, write, and other commands to storage devices (not illustrated). In one embodiment, the filesystem (708) issues such commands to NAND Flash (730). In one embodiment, NAND Flash (730) may comprise a solid-state drive or similar device that implements one or more NAND Flash chips such as chip (304) described in the description of FIG. 3 which is incorporated by reference. In general, NAND Flash (730) comprises any NAND Flash-based device that implements a chip such as that illustrated in FIG. 3.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example in order to provide a more complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A system comprising:
    a NAND Flash storage device comprising a plurality of NAND Flash pages;
    a NAND Flash translation layer (FTL) configured to convert a logical block address (LBA) of a NAND Flash page to a physical block address (PBA);
    a syndrome calculator configured to calculate a syndrome using an LBA and an LBA parity matrix, the LBA associated with a read command issued by a host device; and
    an error-correcting code (ECC) decoder configured to:
        read a codeword located at a PBA associated with the LBA associated with the read command, the codeword including a plurality of user data bits and a plurality of parity bits,
        confirm that the codeword does not contain an error if the codeword converges with the syndrome, and
        transmit the user data bits to the host device as a response to the read command.

2. The system of claim 1, further comprising an ECC encoder configured to:
    receive a write command from the host device, the write command including a second LBA and second user data;
    generate a second plurality of parity bits based on the second user data and a generator matrix corresponding to a parity check matrix and a data matrix; and
    write the user data and the parity bits to a second NAND Flash page corresponding to the second LBA.

3. The system of claim 2, the generator matrix created by transposing a parity check matrix.

4. The system of claim 1, the plurality of parity bits stored in an out-of-band (OOB) portion of the NAND Flash page.

5. The system of claim 1, the ECC decoder further configured to:
    determine that that the codeword does not converge with the syndrome;
    append the LBA to the codeword; and
    decode the codeword using a full parity check matrix comprising a parity check matrix and the LBA parity matrix.

6. The system of claim 1, the ECC decoder further configured to confirm that the codeword does not contain an error if the codeword converges with the syndrome.

7. The system of claim 1, the ECC decoder further configured to signal that an error exists in the codeword if the codeword does not converge with the syndrome.

8. The system of claim 1, the confirming that the codeword does not contain an error if the codeword converges with the syndrome further comprising assigning a maximum confidence level to a portion of the codeword including the LBA.

9. The method of claim 1, the ECC decoder comprising a soft-decision decoder.

10. A method comprising:
    receiving a read command from a host device, the read command including a logical block address (LBA) of a NAND Flash page;
    reading a codeword located at a physical block address (PBA) associated with the LBA, the codeword including a plurality of user data bits and a plurality of parity bits;
    calculating a syndrome using the LBA and an LBA parity matrix;
    confirming that the codeword does not contain an error if the codeword converges with the syndrome; and
    transmitting the user data bits to the host device as a response to the read command.

11. The method of claim 10, further comprising:
    receiving a write command from the host device, the write command including a second LBA and second user data;
    generating a second plurality of parity bits based on the second user data and a generator matrix corresponding to a parity matrix and a data matrix; and
    writing the user data and the parity bits to a second NAND Flash page corresponding to the second LBA.

12. The method of claim 11, the generator matrix created by transposing a parity check matrix.

13. The method of claim 10, the plurality of parity bits stored in an out-of-band (OOB) portion of the NAND Flash page.

14. The method of claim 10, further comprising generating the physical block address using a NAND Flash transformation layer (FTL).

15. The method of claim 10, further comprising:
    determining that that the codeword does not converge with the syndrome;
    appending the LBA to the codeword; and
    decoding the codeword using a full parity check matrix comprising a parity check matrix and the LBA parity matrix.

16. The method of claim 15, further comprising confirming that that the codeword does not contain an error if the codeword converges with the syndrome.

17. The method of claim 16, further comprising signaling that an error exists in the codeword if the codeword does not converge with the syndrome.

18. The method of claim 15, the confirming that the codeword does not contain an error if the codeword converges with the syndrome comprising assigning a maximum confidence level to a portion of the codeword including the LBA.

19. The method of claim 18, the confirming that the codeword does not contain an error if the codeword converges with the syndrome comprising utilizing a soft-decision decoder to confirm whether the codeword converges with the syndrome.

20. A method comprising:
    selecting, by a memory device, a NAND Flash page;
    reading, by the memory device, user data and parity bits stored in the NAND Flash page;
    appending, by the memory device, a logical block address (LBA) portion to the user data and parity bits to form a codeword, the LBA portion comprising all zeros;
    assigning, by the memory device, a likelihood to each bit in the LBA portion;
    decoding, by the memory device, the codeword with a soft-decision decoder, the soft decision decoder using a message-passing algorithm; and confirming, by the memory device, an LBA of the NAND Flash page after at least one iteration of the message-passing algorithm.

\* \* \* \* \*